United States Patent [19]

Shimada

[11] Patent Number: 5,675,484
[45] Date of Patent: Oct. 7, 1997

[54] WIDE INPUT VOLTAGE RANGE POWER SUPPLY WITH AUTO-TRANSFORMERS AND PIEZOELECTRIC TRANSFORMER

[75] Inventor: Yasuhei Shimada, Tokyo, Japan

[73] Assignee: NEC Corporation, Tokyo, Japan

[21] Appl. No.: 623,028

[22] Filed: Mar. 28, 1996

[30] Foreign Application Priority Data

Mar. 28, 1995 [JP] Japan ................. 7-069207

[51] Int. Cl.[6] .................................. H02M 7/537
[52] U.S. Cl. .................. 363/71; 363/97; 363/131
[58] Field of Search .................... 363/20, 21, 710, 363/97, 131

[56] References Cited

U.S. PATENT DOCUMENTS 3,736,446  5/1973  Berlincourt ........................ 310/8
5,424,935  6/1995  Wu ................................ 363/97
5,548,189  8/1996  Williams ........................ 363/133

*Primary Examiner*—Jeffrey L. Sterrett
*Attorney, Agent, or Firm*—Sughrue, Mion, Zinn, Macpeak and Seas

[57] ABSTRACT

N-channel enhancement type switching transistors complementarily turn on and off in response to pulse signals complementary to each other so as to cause two auto-transformers to alternately supply secondary potentials to primary electrodes of a piezoelectric transformer, and the piezoelectric transformer supplies an alternating current signal to a load; the primary winding portion of each auto-transformer is dually used in the accumulation of current energy and the resonating phenomenon for generating the secondary potential, and, for this reason, the auto-transformers make the driving circuit for the load compact.

4 Claims, 14 Drawing Sheets

WIDE INPUT VOLTAGE RANGE POWER SUPPLY WITH AUTO-TRANSFORMERS AND PIEZOELECTRIC TRANSFORMER

FIELD OF THE INVENTION

This invention relates to a driving circuit and, more particularly, to a small thin driving circuit with auto-transformers and a piezoelectric transformer operable under a wide power voltage range.

DESCRIPTION OF THE RELATED ART

A piezoelectric transformer is a voltage-to-voltage converter on the basis of a piezoelectric effect, and has primary and secondary electrodes differently polarized on a piezoelectric element. When a potential level is applied to the primary electrode, the piezoelectric transformer converts the potential level to a different potential level through the piezoelectric effect. The piezoelectric transformer is easily scaled down rather than an electromagnetic transformer, and is desirable for a power source of a back light incorporated in a liquid crystal display unit.

A typical example of the driving circuit for the piezoelectric element is disclosed in Japanese Patent Publication of Unexamined Application No. 3-139178, and FIG. 1 illustrates the prior art driving circuit. FIG. 2 shows an equivalent circuit of the prior art driving circuit. The prior art driving circuit is associated with a piezoelectric element 1 or an ultrasonic motor, and comprises a 2-phase pulse generator 2, two transformers 3a and 3b and two switching transistors 4a and 4b.

The 2-phase pulse generator 2 generates first and second pulse signals PL1 and PL2 different in phase from one another, and the first and second pulse signals PL1 and PL2 are supplied to the gate electrodes of the switching transistors 4a and 4b, respectively.

The switching transistors 4a and 4b are connected between the primary windings of the transformers 4a/4b and the ground, and the secondary windings of the transformers 3a/3b are connected to primary electrodes of the piezoelectric element 1.

The switching transistors 4a and 4b alternately turn on and off, and generate a resonant voltage waveform in the primary windings. The resonant voltage waveform is boosted from the primary windings to the secondary windings, and the boosted resonant voltage waveform is applied to the piezoelectric element 1.

FIG. 3 illustrates the circuit behavior of the prior art driving circuit. The switching transistor 4a turns on at time t1, and turns off at time t2. The switching transistor 4a gives rise to an increase of the drain current Id1 between time t1 and time t2, and the drain voltage Vd1 is approximately equal to the ground level therebetween. The drain current Id1 is expressed by equation 1.

$$Id1 = VDD \times t / Lp1 \qquad \text{Equation 1}$$

where VDD is the positive power voltage applied to the primary windings, Lp1 is the inductance of on the primary winding of the transformer 3a and t is time. The drain current Id1 forms a saw tooth pulse.

The switching transistor 4a is turned off between time t2 and time t3. When the switching transistor 4a turns off, the electromagnetic transformer 3a releases the accumulated current energy as voltage energy, and boosts the voltage at the turn ratio so as to apply it to the piezoelectric element 1. The resonance takes place due to the input capacitance C of the piezoelectric element 1 (see FIG. 2) and the inductance on the secondary winding Ls1, and forms the half of a sinusoidal wave.

On the other hand, the other switching transistor 4b turns off at time t1, and turns on at time t2. The switching transistor 4b is turned on from time t2 to time t3. Thus, the switching transistors 4a and 4b complementarily turns on and turns off, and generates the resonant voltage waveform Vout between the secondary windings. The resonant voltage waveform is equivalent to a sinusoidal wave at the piezoelectric element 1, and, for this reason, the vibrations on the piezoelectric transformer 1 contain small amount of harmonics.

Although the prior art driving circuit shown in FIG. 1 aims at generation of the mechanical vibrations, the prior art driving circuit is available for a piezoelectric transformer, and is expected to stably control current/voltage applied to the load. Moreover, the prior art driving circuit is expected to drive the piezoelectric transformer around a resonant frequency determined by the physical configuration thereof and further to be integrated with the piezoelectric transformer without enlargement. Thus, the prior art driving circuit for the piezoelectric transformer is different in technical goal from the driving circuit for the piezoelectric element 1.

As described hereinbefore, while the prior art driving circuit is driving the piezoelectric element 1, the drain current Id1 flows as expressed by equation 1. The other electromagnetic transformer 3b causes the drain current Id2 to complementarily flow through the switching transistor 4b, and the amount of the drain current Id2 is similarly expressed. When the power voltage VDD is increased, the electromagnetic transformers 3a/3b proportionally increase the drain currents Id1/Id2, and a designer needs to set a limit on the maximum drain current, because the magnetic saturation causes the electromagnetic transformers 3a/3b to lose the inductance. The loss of the inductance results in large amount of current and, accordingly, damages of the electromagnetic transformers 3a/3b and the associated switching transistor 4a/4b. The designer gives a large margin to the maximum drain current, and the large margin enlarges the electromagnetic transformers 3a/3b.

When the power voltage VDD is widely changed, a prior art power source or a prior art inverter limits the peak current by decreasing the switching intervals. However, in the case where the prior art ultrasonic motor driving circuit is used for a piezoelectric element, the driving frequency is allowed to vary within several percent, because the piezoelectric element has a large quality factor and a narrow resonant frequency range. This means that the prior art driving circuit hardly copes with the wide variation of the power voltage VDD. If the fluctuation in the power voltage VDD is wide, the driving voltage is proportionally increased, and the large amount of driving voltage destroys the piezoelectric element. Thus, the stabilization of the power voltage is requested for the prior art driving circuit.

If a dc-to-dc converter is connected to the prior art driving circuit, the dc-to-dc converter makes the power voltage VDD stable. However, the dc-to-dc converter deteriorates the efficiency of the prior art driving circuit, and cancels the high efficiency of the piezoelectric element. Although the dc-to-dc converter coupled to the driving circuit makes the power voltage stable, the dc-to-dc converter decreases the efficiency of the piezo-electric element. The dc-to-dc converter is less appropriate because of its complicated arrangement.

The prior art driving circuit requires large switching transistors 4a/4b so as to discharge the drain currents Id1/

Id2, and the large switching transistors 4a/4b make the prior art driving circuit thick. Thus, a problem is encountered in the prior art driving circuit in the large volume due to the large switching transistors 4a/4b and the electromagnetic transformers 3a/3b.

In summary, the prior art driving circuit encounters a problem in large volume. Moreover, the prior art driving circuit further has problems in the narrow driving frequency range and in the narrow power voltage range.

SUMMARY OF THE INVENTION

It is therefore an important object of the present invention to provide a driving circuit which is small, thin and operable under a wide voltage range.

To accomplish the object, the present invention proposes to use auto-transformers.

In accordance with the present invention, there is provided a driving circuit for a load comprising: a first auto-transformer including a first winding having a first node splitting the first winding into a first primary winding portion connected to a power source and a first secondary winding portion; a second auto-transformer including a second winding having a second node splitting the second winding into a second primary winding portion connected to the power source and a second secondary winding portion; a first switching transistor including a first control node and a first current path connected between the first node and a constant voltage source; a second switching transistor including a second control node and a second current path connected between the second node and the constant voltage source; a piezoelectric transformer including primary electrodes respectively connected to the first secondary winding portion and the second secondary winding portion, and a secondary electrode connected to the load; and a pulse generating means for supplying a first pulse signal and a second pulse signal complementary to the first pulse signal to the first control node and the second control node, respectively.

BRIEF DESCRIPTION OF THE DRAWINGS

The features and advantages of the driving circuit according to the present invention will be more clearly understood from the following description taken in conjunction with the accompanying drawings in which.

DESCRIPTION OF THE PREFERRED EMBODIMENT

Figure 4:
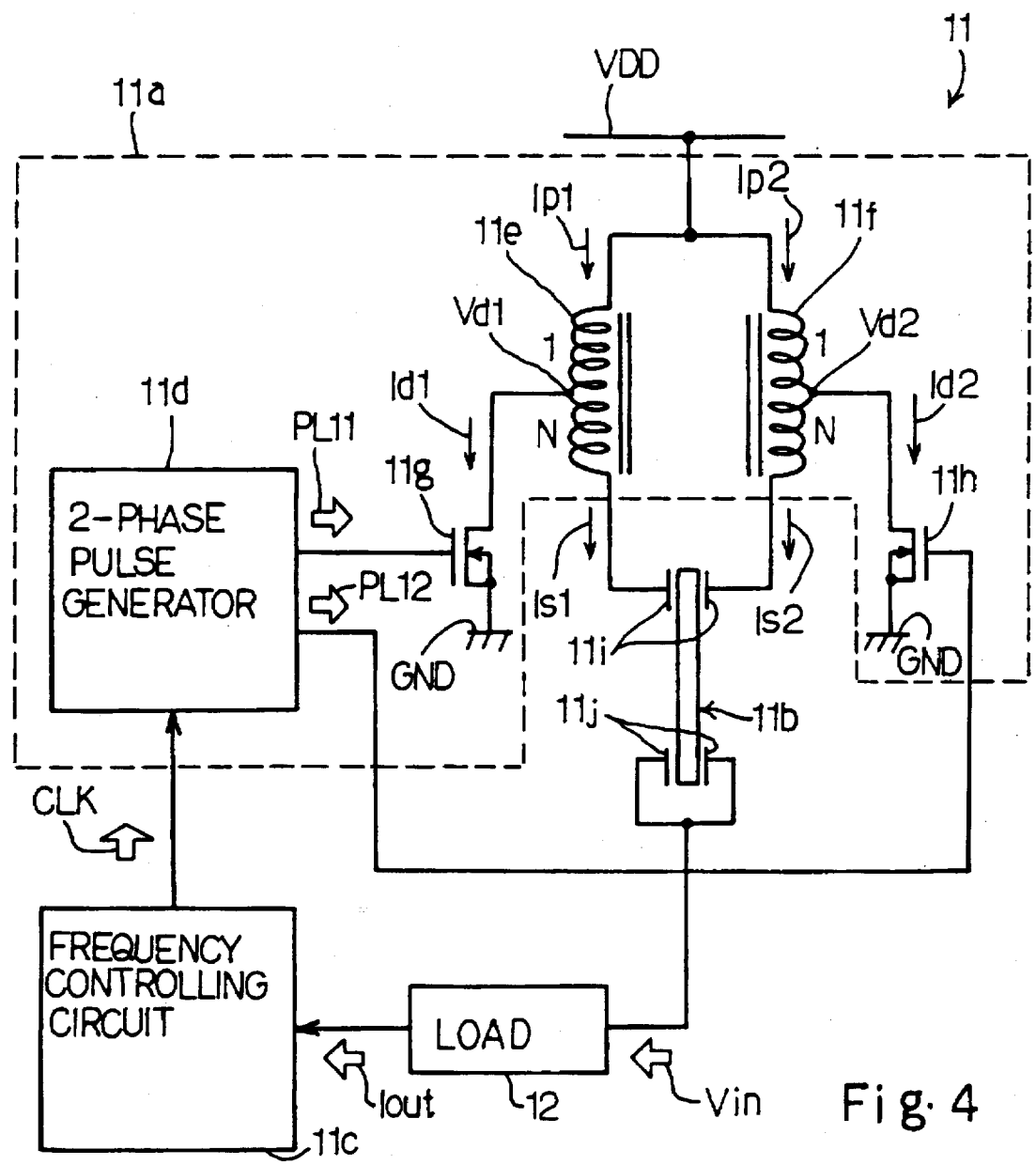
FIG. 4 is a circuit diagram showing a driving circuit according to the present invention.

Referring first to FIG. 4 of the drawings, a driving circuit 11 embodying the present invention is connected to a load 12, and largely comprises a boosting circuit 11a, a piezoelectric transformer 11b and a frequency controlling circuit 11c.

The boosting circuit 11a includes a 2-phase pulse generator 11d for generating first and second pulse signals PL11 and PL12, and the first pulse signal PL11 is complementary to the second pulse signal PL12. The frequency controlling circuit 11c supplies a clock signal CLK1 to the 2-phase pulse generator 11d, and the 2-phase pulse generator 11d generates the first and second pulse signals PL11 and PL12 from the clock signal CLK. As will be described hereinafter, the clock signal CLK is variable in frequency, and, accordingly, changes the frequency of the first and second pulse signals PL11/PL12. In this instance, the frequency controlling circuit 11c and the 2-phase pulse generator 11d as a whole constitute a pulse generating means.

The boosting circuit 11a further includes first and second electromagnetic transformers 11e and 11f and first and second n-channel enhancement type switching transistors 11g and 11h. The first pulse signal PL11 and the second pulse signal PL12 are respectively supplied to the gate electrode of the n-channel enhancement type switching transistor 11g and the gate electrode of the n-channel enhancement type switching transistor 11h, and the first and second n-channel enhancement type switching transistors 11g/11h provide current paths between intermediate nodes of the first and second electromagnetic transformers 11e/11f and a ground line GND.

The first and second electromagnetic transformers 11e and 11f are connected between a power voltage line VDD and primary electrodes of the piezoelectric transformer 11b, and a secondary electrode of the piezoelectric transformer 11b is connected to the load 12.

The piezoelectric transformer 11b supplies a sinusoidal resonant driving signal Vin to the load 12, and a discharge current Iout flows from the load 12 to the frequency controlling circuit 11c.

Figure 5:
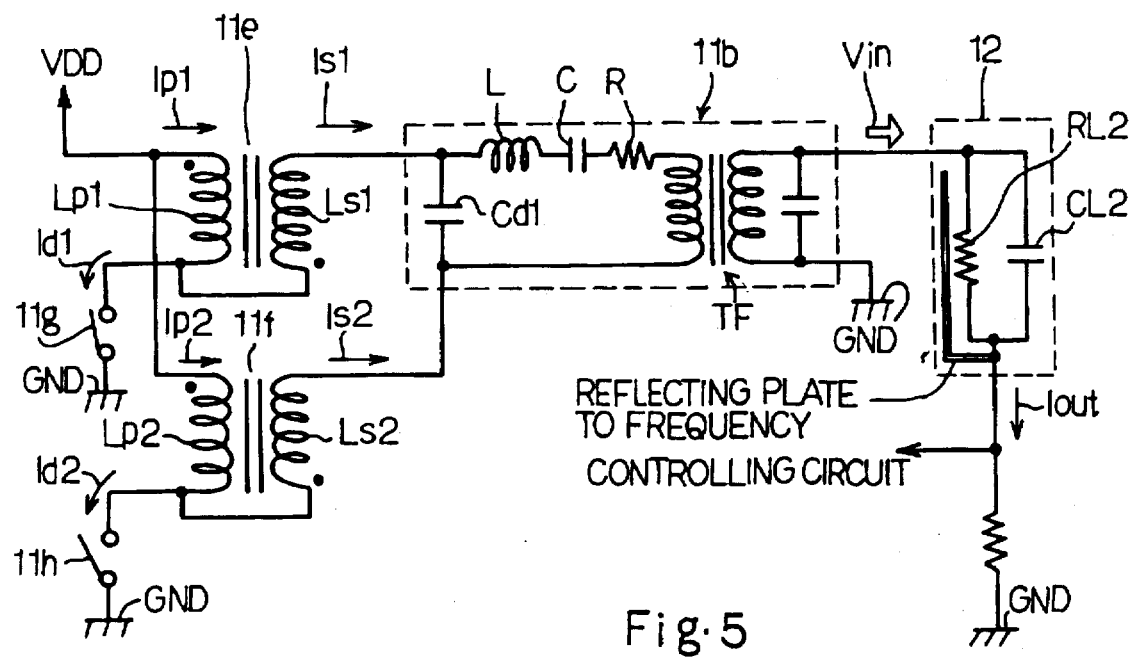
FIG. 5 is a circuit diagram showing the equivalent circuit of a boosting circuit incorporated in the driving circuit.
Figure 6A:
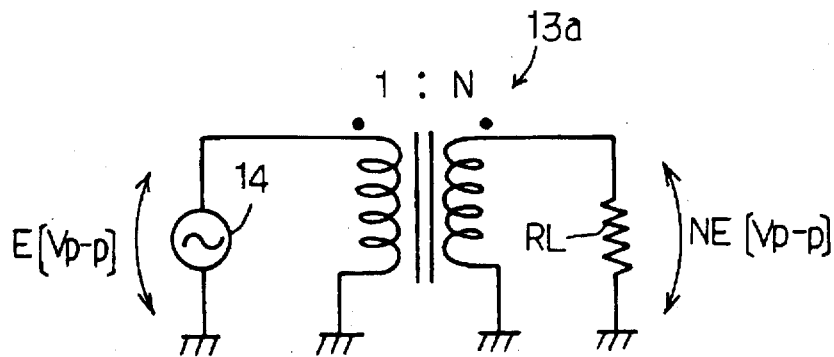
FIGS. 6A to 6C are circuit diagrams showing a standard electromagnetic transformer, an equivalent electromagnetic transformer and an auto-transformer incorporated in the driving circuit.
Figure 6B:
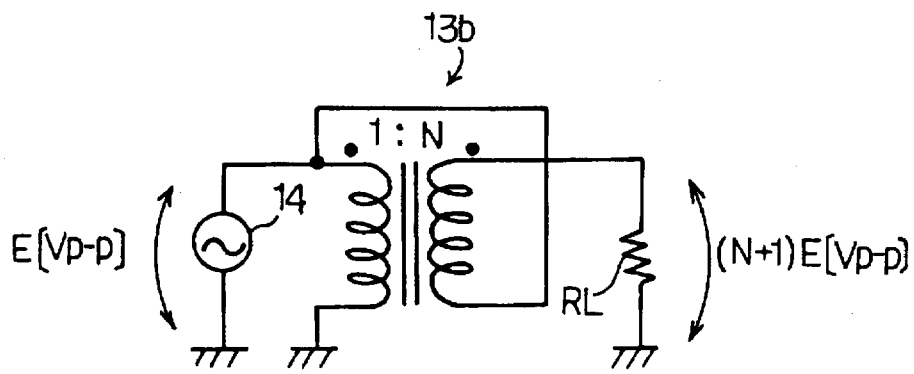
Figure 6C:
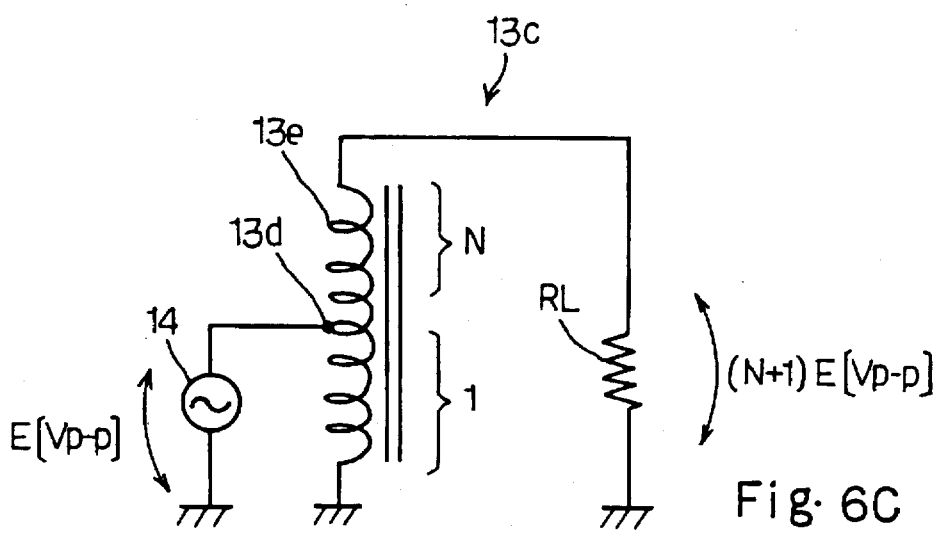

If the load 12 is a cold cathode fluorescent lamp, the driving circuit 11a is equivalent to a circuit configuration shown in FIG. 5. In this instance, the output current Is2 of the electromagnetic transformer 11f flows through the primary winding of an equivalent transformer TF, an equivalent resistor R, an equivalent capacitor C, an equivalent inductor L and an input capacitor Cd1 into the secondary winding of the electromagnetic transformer 11e. The electromagnetic transformers 11e and 11f are auto-transformers. FIGS. 6A to 6C illustrate a standard electromagnetic transformer, an equivalent electromagnetic transformer and an auto-transformer, and the turn ratio of the transformers 13a, 13b and 13c is 1:N.

FIG. 6A shows the transformer 13a having the primary winding connected between an alternating current source 14 and the ground line and the secondary winding connected to a load RL and the ground line. When the alternating current source 14 supplies an alternating voltage E[Vp–p], the secondary winding generates an alternating voltage NE[Vp–p]. If the second winding is connected to the alternating current source 14 as shown in FIG. 6B, the alternating voltage N[Vp–p] is added to the output voltage of the secondary winding, and the output voltage is expressed as (N+1)E[Vp–p].

If the alternating current source 14 is connected to an intermediate node 13d so as to split a winding 13e at N:1, the transformer 13c serves as the auto-transformer equivalent to the transformer 13b, and applies the output voltage (N+1)E[Vp–p] to the load RL. Each of the electromagnetic transformers 11e/11f is similar in configuration to the auto-transformer 13c, and is advantageous over the transformer 13b in large step-up ratio under the same turns or a smaller number of turns under the same step-up ratio.

The electromagnetic transformers 11e and 11f are similar to the auto-transformer, and make the boosting circuit 11a compact.

Figure 7:
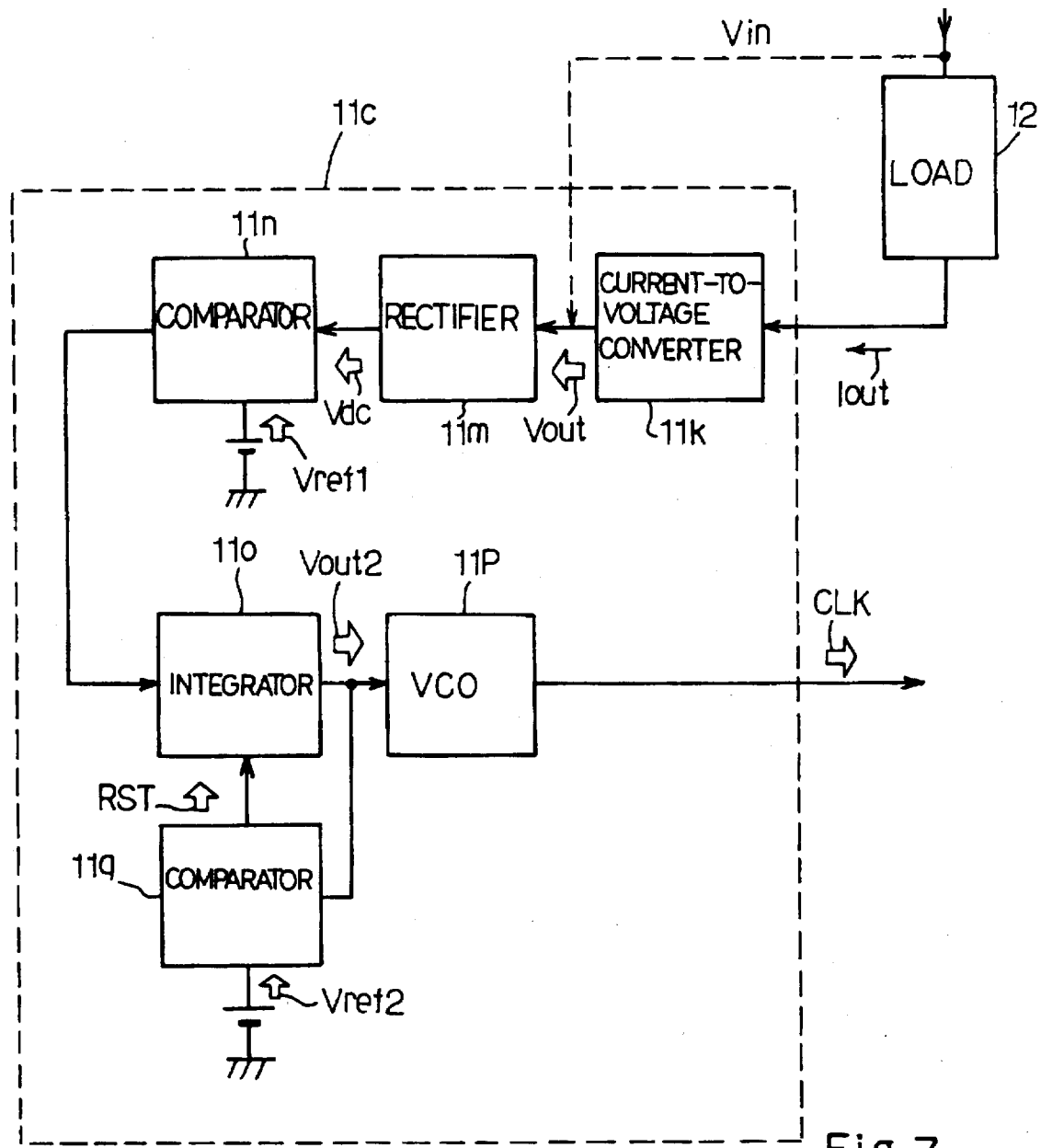
FIG. 7 is a block diagram showing the circuit arrangement of a frequency controlling circuit incorporated in the driving circuit.

FIG. 7 illustrates the circuit arrangement of the frequency controlling circuit 11c. The frequency controlling circuit 11c includes a current-to-voltage converter 11k, a rectifier 11m and comparator 11n. The current-to-voltage converter 11k is, by way of example, implemented by a resistor. The current-to-voltage converter 11k converts the discharge current Iout to an alternating voltage signal Vout1, and the rectifier 11m generates a dc voltage signal Vdc from the alternating voltage signal Vout1. The comparator 11n compares the dc voltage signal Vdc with a first reference voltage signal Vref1. When the dc voltage signal Vdc is lower than the first reference voltage signal Vref1, the comparator 11n generates a high level signal. On the other hand, if the dc voltage signal Vdc is higher than the first reference voltage signal Vref1, the comparator 11n generates a low level signal.

The frequency controlling circuit 11c further includes an integrator 11o, a voltage-controlled oscillator 11p abbreviated as "VCO" and a comparator 11q. While the comparator 11n is supplying the high level signal to the integrator 11o, the integrator 11o decreases a frequency control signal Vout2 at a predetermined rate, and the frequency control signal Vout2 is supplied to the voltage-controlled oscillator 11p. The voltage controlled oscillator 11p is responsive to the frequency control signal Vout2 so as to change the frequency of the first and second pulse signals PL11/PL12. On the other hand, if the comparator 11n supplies the low level signal to the integrator 11o, the integrator 11o maintains the frequency control signal Vout2 at a potential level immediately before the change from the high level signal to the low level signal.

Figure 8:
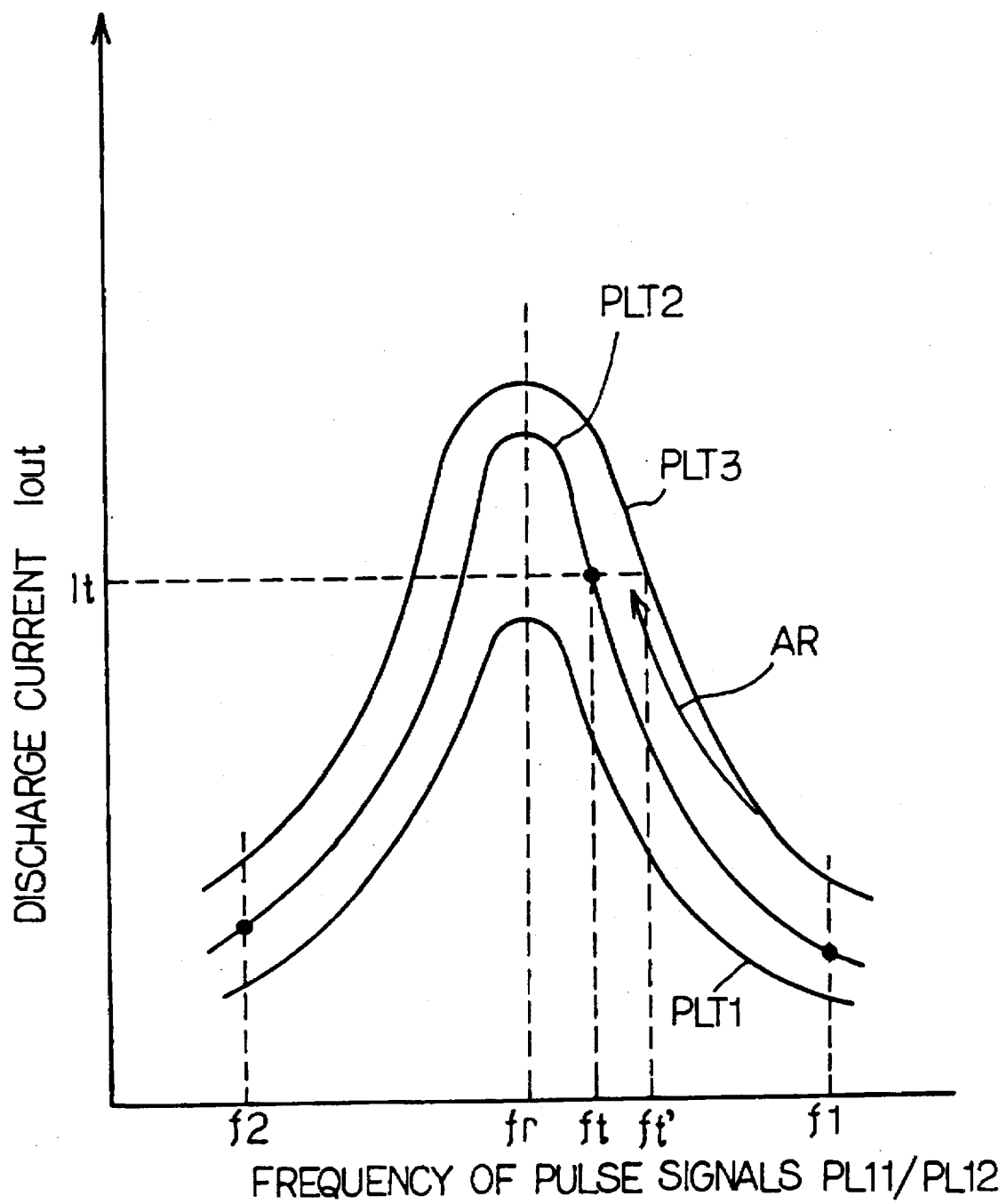
FIG. 8 is a graph showing current-to-frequency characteristics of the frequency controlling circuit.

The comparator 11q compares the frequency control signal Vout2 with a second reference voltage signal Vref2, and supplies a reset signal RST to the integrator 11o as follows. If the power voltage VDD is decreased or the load 12, such as a cold cathode fluorescent lamp, does not supply the discharge current Iout to the current-to-voltage converter 11k until lamp activation, the comparator 11n continuously supplies the high level signal, and the integrator 11o causes the voltage-controlled oscillator 11p to decrease the frequency of the first and second pulse signals P11/PL12 from an initial value f1 to the minimum value f2 (see FIG. 8). Then, the frequency control signal Vout2 becomes lower than the second reference voltage signal Vref2, and the comparator 11q generates the reset signal RST. The integrator 11o causes the frequency control signal Vout2 to return to an initial value corresponding to the initial frequency f1. Thus, the comparator 11q and the integrator 11o cause the voltage-controlled oscillator 11p to loop the frequency of the first and second pulse signals PL11/PL12 between f1 and f2.

Assuming now that the frequency controlling circuit 11c starts the frequency regulation, the integrator 11o sets the frequency control signal Vout2 to the initial value, and the voltage controlled oscillator 11p oscillates so as to generate the clock signal CLK at the initial frequency f1. The initial frequency f1 is higher than a target frequency ft close to a resonant frequency fr of the piezoelectric transformer 11b, and the piezoelectric transformer 11b is controlled at the frequency f1. In this situation, the dc voltage signal Vdc is lower than the first reference voltage signal Vref1, and the comparator 11n causes the integrator 11o to decrease the frequency control signal Vout2. As a result, the voltage controlled oscillator 11p decreases the frequency f as indicated by arrow AR. When the discharge current Iout reaches a target value It, the voltage controlled oscillator regulates the frequency f to the target value ft.

If the power voltage VDD is too low to obtain the target discharge current It as indicated by plots PLT1, the clock signal CLK reiterates the loop between f1 and f2 until a recovery of the power voltage VDD. When the power voltage VDD is recovered to a standard level, the frequency controlling circuit 11c changes the clock signal CLK along plots PLT2.

On the other hand, if the power voltage VDD is higher than the standard level, the frequency controlling circuit 11c changes the clock signal CLK along plots PLT3, and the target frequency ft' is slightly spaced from the resonant frequency fr.

As will be understood from the foregoing description, even if the power voltage VDD fluctuates, the frequency controlling circuit 11c regulates the clock signal CLK and, accordingly, the first and second pulse signals PL11/PL12 to a neighborhood of the resonant frequency fr.

Figure 9:
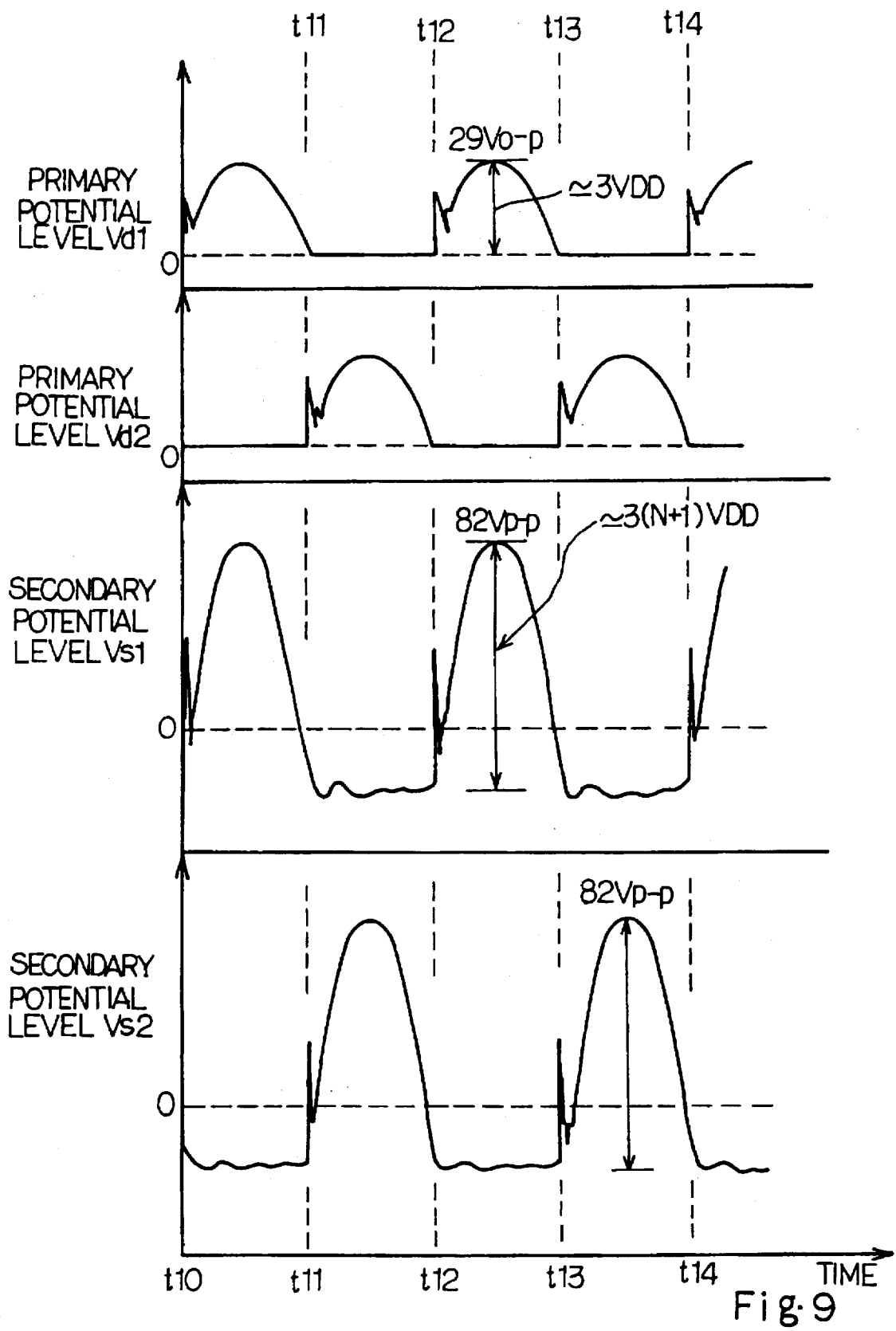
FIG. 9 is a graph showing potential levels at essential nodes of electromagnetic transformers incorporated in the driving circuit.

Description is hereinbelow made on the circuit behavior of the driving circuit 11 with reference to FIGS. 9, 10 and 11.

When the driving circuit is powered, the frequency controlling circuit 11c firstly supplies the clock signal CLK at the initial frequency f1, and regulates the clock signal CLK to the target frequency ft as described previously. The 2-phase pulse generator 11d respectively supplies the first and second clock signals PL11/PL12 to the first and second n-channel enhancement type switching transistors 11g/11h, and the first and second n-channel enhancement type switching transistors 11g and 11h complementarily turn on and off. In this instance, the first n-channel enhancement type switching transistor 11g turns on at time t11 and t13, and the second n-channel enhancement type switching transistor 11h turns on at time t10, t12 and t14.

While the first and second n-channel enhancement type switching transistors 11g/11h are turned on, drain currents Id1 and Id2 flows into the ground line GND, and the power voltage line VDD accumulates current energies Ip1/Ip2 into the primary windings of the first and second electromagnetic transformers 11e/11f. When the first and second n-channel enhancement type switching transistors 11g/11h turn off, the accumulated energies are released, and primary potential levels Vd1 and Vd2 take place as shown in FIG. 9. The primary potential levels Vd1/Vd2 are about three times higher than the power voltage VDD.

The primary potential levels Vd1 and Vd2 are boosted to secondary potential levels Vs1 and Vs2 and the secondary potential levels Vs1 and Vs2 are (N+1) times higher than the primary potential levels Vd1 and Vd2, respectively. The currents Id1, Ip1 and Is1 vary as shown in FIG. 11.

Figure 12:
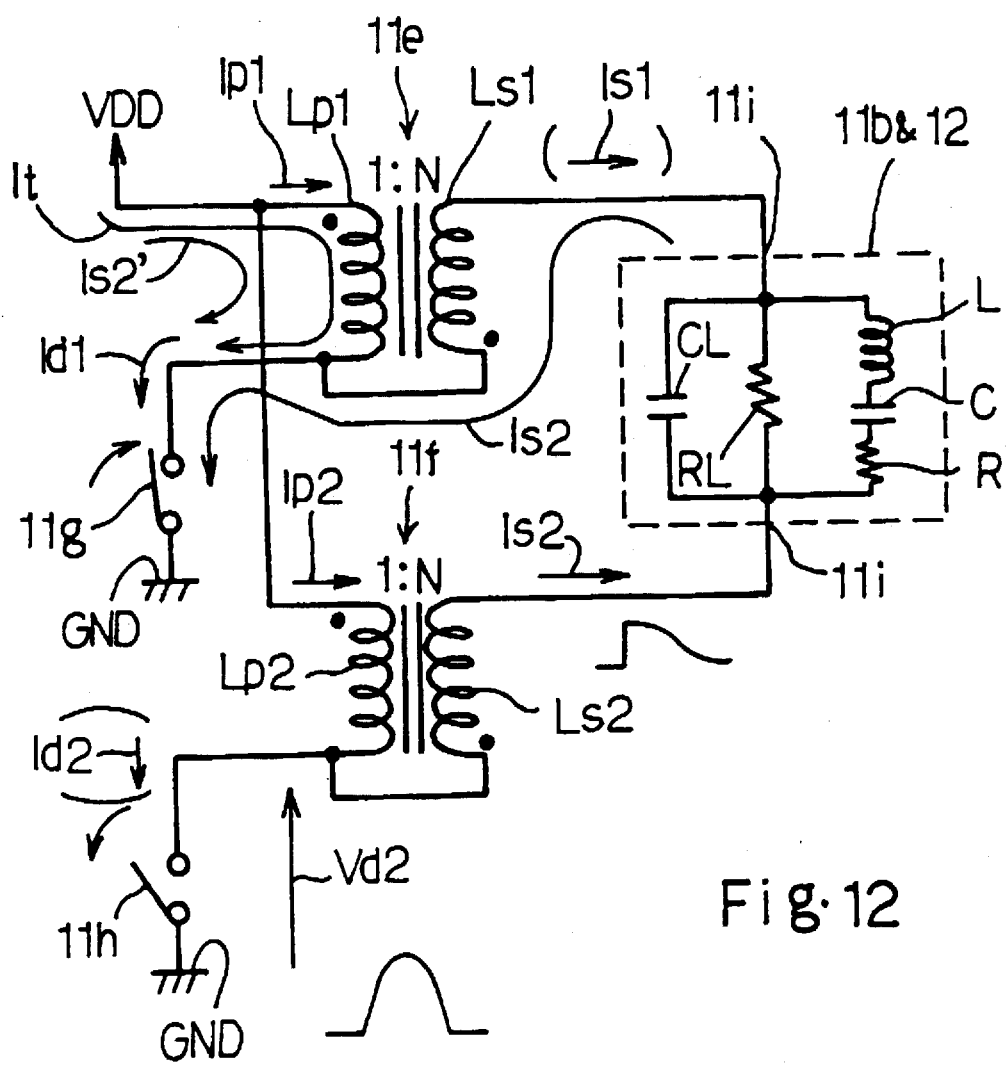
FIG. 12 is a circuit diagram showing the equivalent circuit of the electromagnetic transformers and the piezoelectric transformer.

FIG. 12 illustrates an equivalent circuit of the essential parts of the driving circuit 11, i.e., the electromagnetic transformers 11e/11f, the piezoelectric transformer 11b and the n-channel enhancement type switching transistors 11g/11h. The equivalent circuit is viewed from the primary electrodes 11i of the piezoelectric transformer 11b, and the load 12 is assumed to be a cold cathode fluorescent lamp. The resistance R and the capacitance C of the cold cathode fluorescent lamp are incorporated in the equivalent ideal transformer of the piezoelectric transformer 11b. The primary potentials Vd1/Vd2 and the secondary potentials Vs2/Vs1 form resonant waveforms due to the equivalent input capacitance CL of the piezoelectric transformer 11b and the load 12 (see FIG. 12) and the total inductance of the primary/secondary inductances Lp2/Ls2 or Lp1/Ls1; each resonant waveform is a half of a sinusoidal wave crossing zero volt at a half resonant period of the piezoelectric transformer 11b. The n-channel enhancement type switching transistor 11g/11h in the on-state causes the other electromagnetic transformer 11e/11f to have the primary winding coupled to the low impedance power voltage line VDD and the ground GND and the secondary winding short-circuited, and the other electromagnetic transformer 11e/11f does not have an influence on the resonance.

Figure 10:
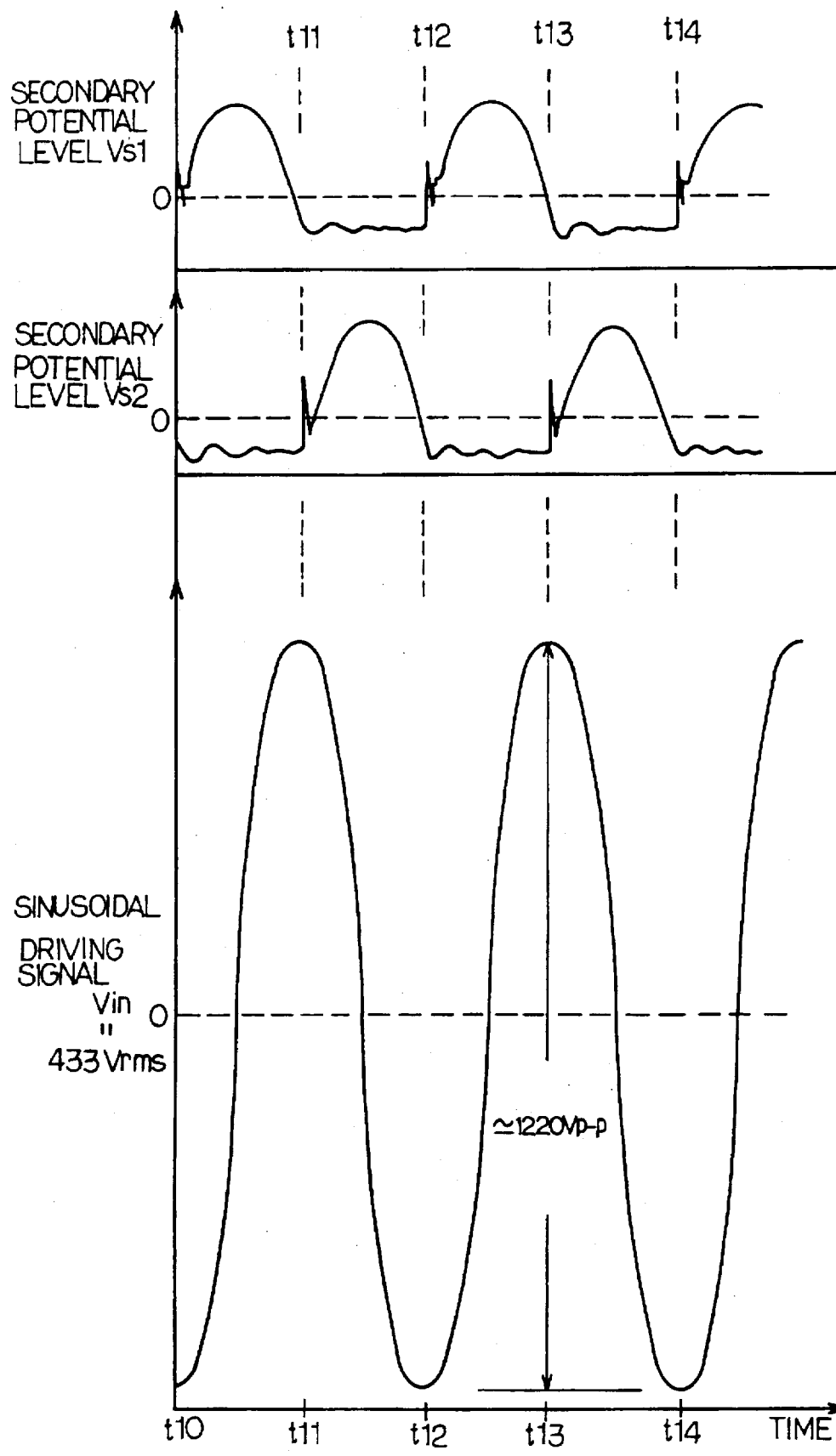
FIG. 10 is a graph showing potential levels at essential nodes of a piezoelectric transformer incorporated in the driving circuit.
Figure 11:
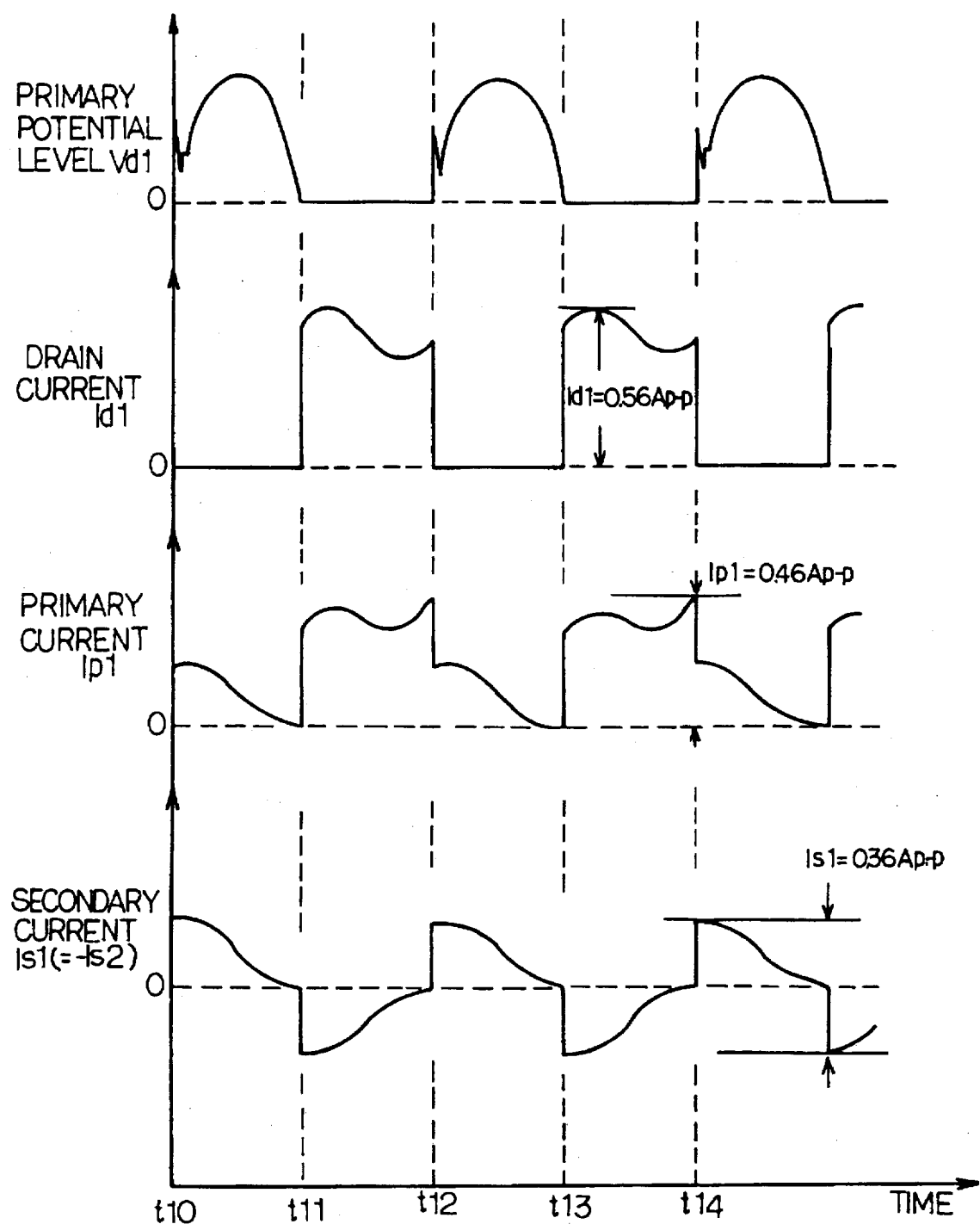
FIG. 11 is a graph showing currents flowing through the essential nodes of the electromagnetic transformer.

The electromagnetic transformers 11e and 11f alternately supply the half sinusoidal waves to the primary electrodes 11i of the piezoelectric transformer 11b, and the piezoelectric transformer 11b generates the sinusoidal driving signal Vin as shown in FIG. 10. The half sinusoidal waves are expressed as 6(N+1)VDD[Vp–p]. The piezoelectric transformer 11b is assumed to boost them at "M", and the potential level of the sinusoidal driving signal Vin is expressed as 6M(N+1)VDD[Vp–p].

The sinusoidal driving signal Vin is supplies to the load 12, and the discharge current Iout flows from the load 12 to the current-to-voltage converter 11k of the frequency controlling circuit 11c. The frequency controlling circuit 11c regulates the clock signal CLK to the target frequency ft as described hereinbefore, and the 2-phase pulse generator 11d, the n-channel enhancement type switching transistors 11g/11h and the electromagnetic transformers 11e/11f cause the piezoelectric transformer 11b to resonate around the resonant frequency fr.

Figure 1:
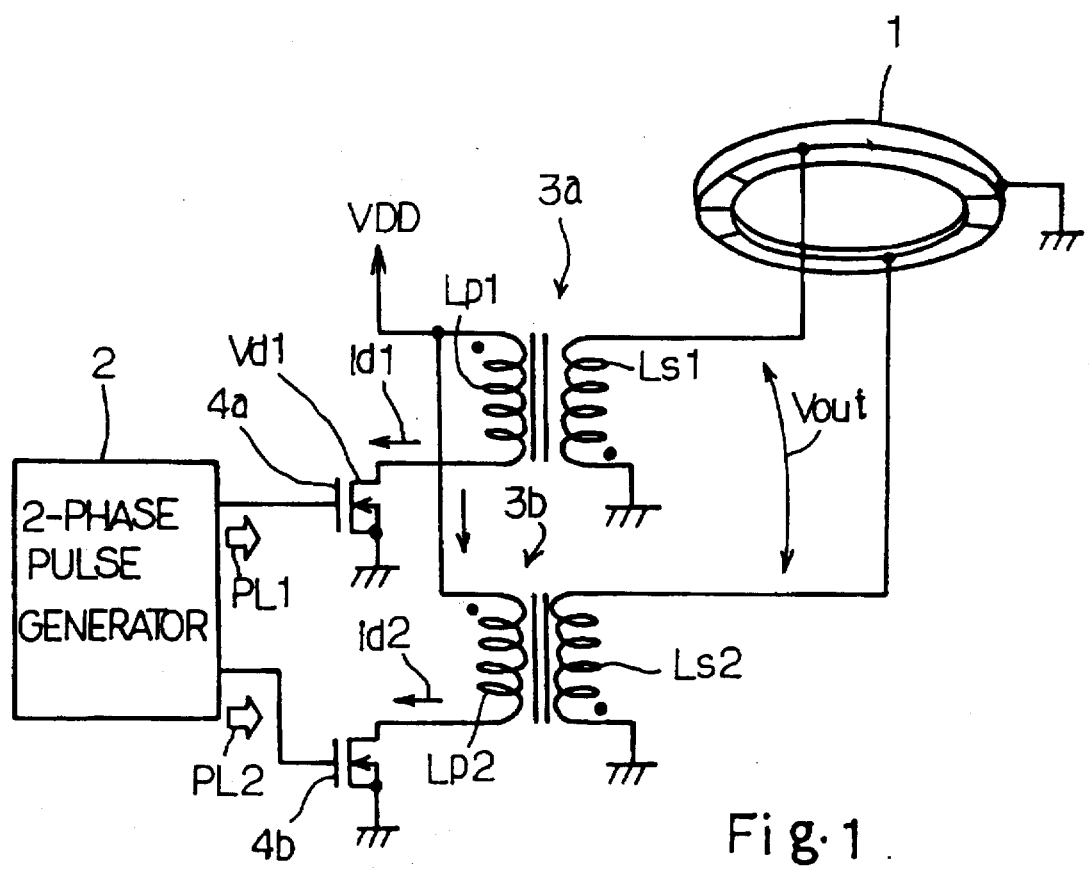
FIG. 1 is a circuit diagram showing the prior art driving circuit.
Figure 2:
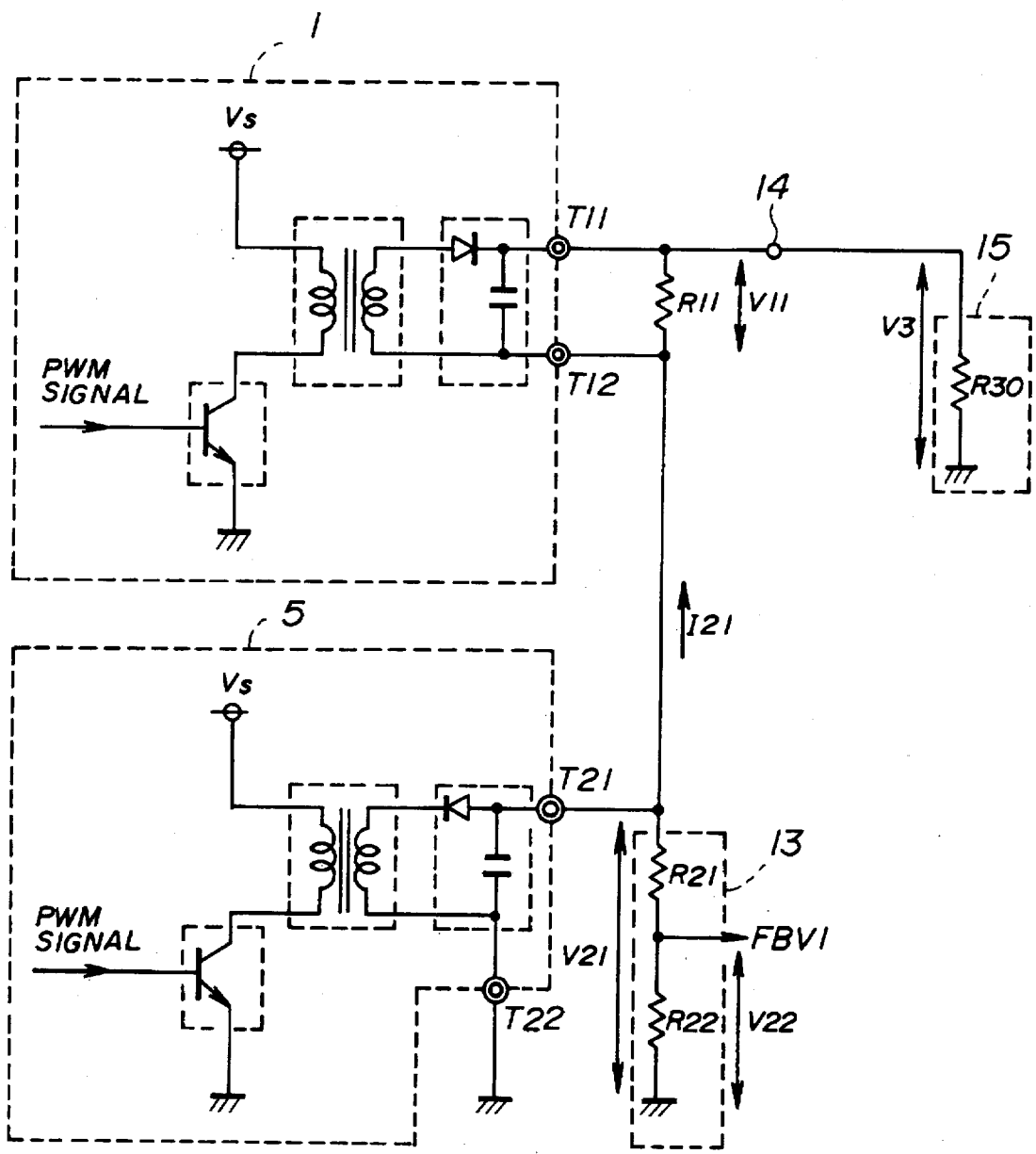
FIG. 2 is a circuit diagram showing the equivalent circuit of the prior art driving circuit.
Figure 3:
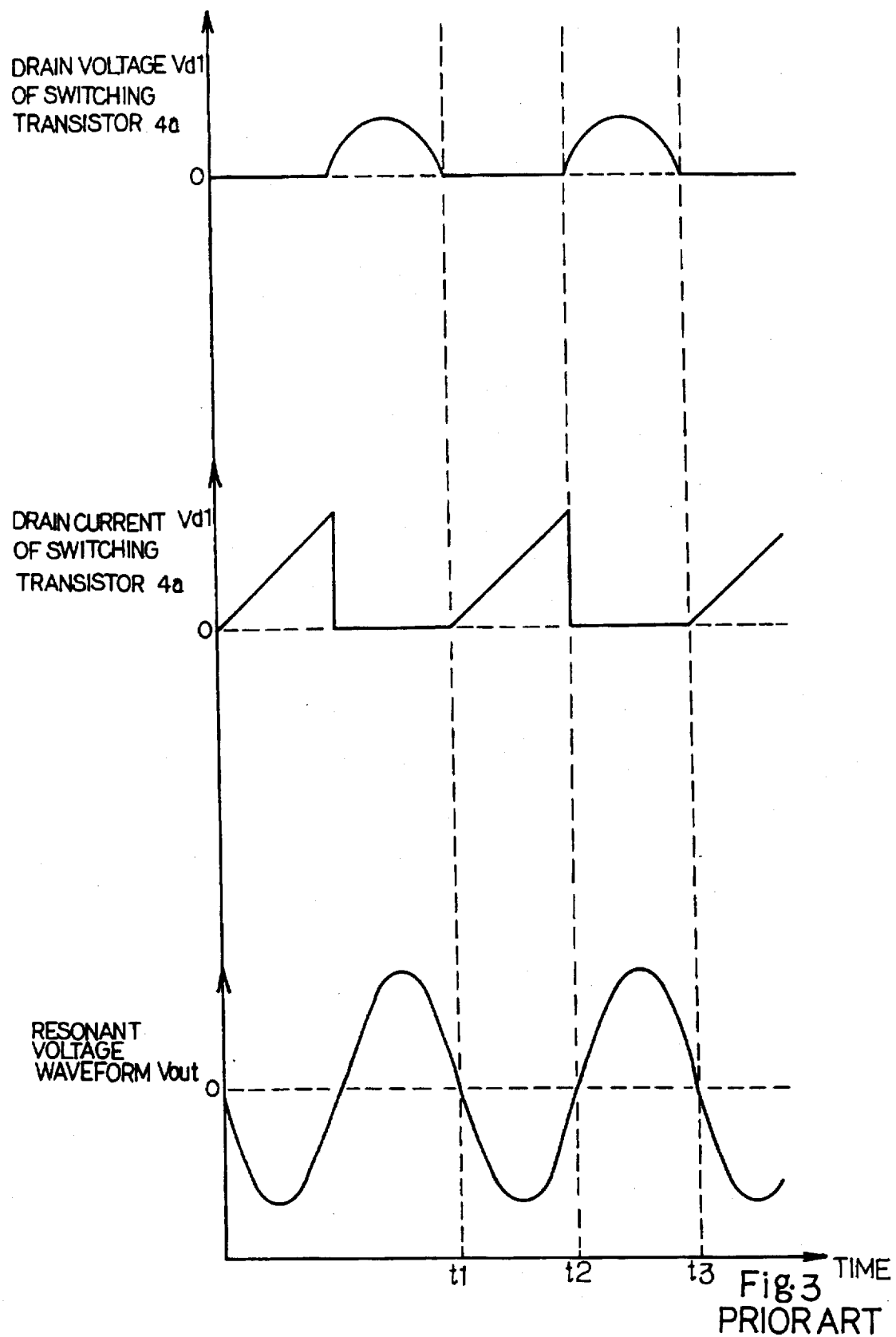
FIG. 3 is a graph showing the drain voltage, the drain current and the resonant voltage waveform in terms of time.

As shown in FIG. 2, the secondary current flows from one of the primary electrodes, and is discharged to the ground. Therefore, the primary electrodes are assumed to be independently grounded, and, accordingly, the electromagnetic transformers 3a and 3b are electrically separated from each other.

On the other hand, the driving circuit according to the present invention does not electrically separate the electromagnetic transformers 11e and 11f as shown in FIG. 12, and the secondary current Is1/Is2 flows into the secondary winding of the other electromagnetic transformer 11f/11e as described hereinbelow.

Figure 13A:
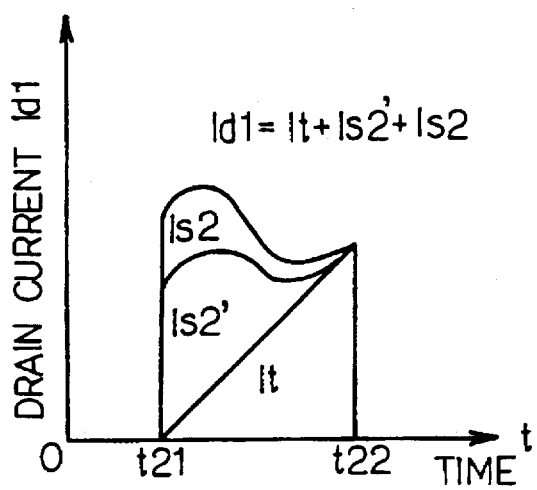
FIGS. 13A to 13C are views showing the waveforms of currents flowing through the electromagnetic transformers.
Figure 13B:
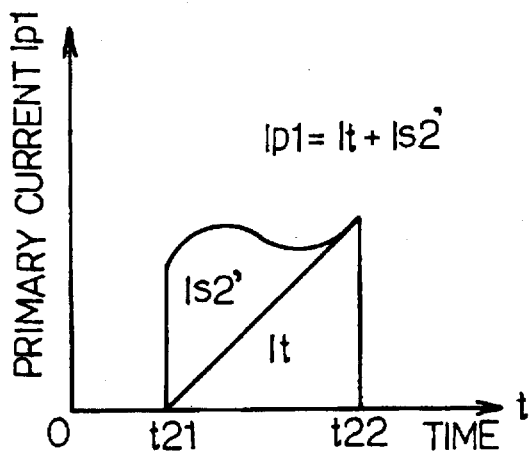
Figure 13C:
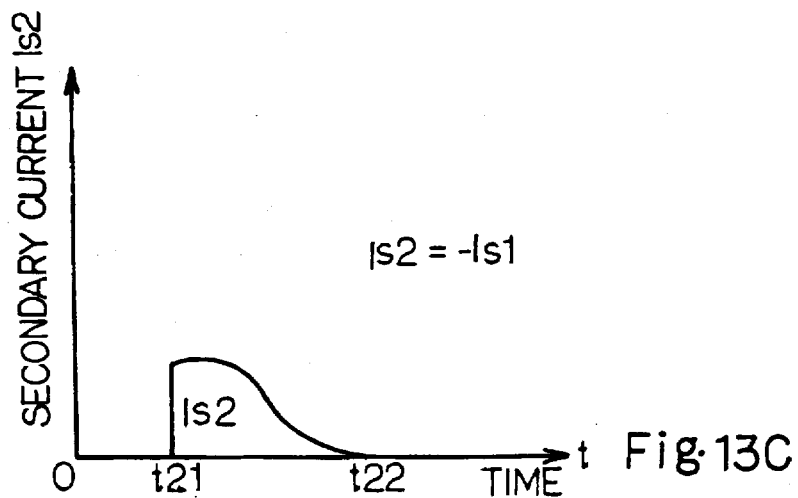

FIGS. 13A, 13B and 13C illustrates the waveforms of the currents Id1, Ip1 and Is2 flowing through the electromagnetic transformers 11e/11f. The n-channel enhancement type switching transistor 11g turns on at time t21 and, accordingly, the other switching transistor 11h complementarily turns off.

The electromagnetic transformer 11f has been charged before t21, and a resonant potential wave takes place in the primary winding of the electromagnetic transformer 11f at time t21. The electromagnetic transformer 11f boosts the resonant potential wave, and the current Is2 flows through the piezoelectric transformer 11b and the load 12 as shown in FIG. 13C. The current Is2 passes through between the primary electrodes of the piezoelectric transformer 11b, and is discharged through the switching transistor 11g to the ground line GND. The electrostatic capacitance of the electromagnetic/piezoelectric transformers 11e/11f/11b is determined in such a manner that the current Is2 is recovered to zero at time t21.

The primary inductance Lp1 of the electromagnetic transformer 11e increases the current It proportionally to the lapse of time from the turn-on, and the electromagnetic transformer 11e magnifies the current Is2 to the current Is2' at "N". As a result, the total Id1 of the currents It, Is2 and Is2' forms a non-linear waveform, and flows through the switching transistor 11g as shown in FIG. 13A.

The primary winding of the electromagnetic transformer 11e allows the total current of It and Is2' to flow therethrough as shown in FIG. 13B.

The n-channel enhancement type switching transistor 11g turns off at time t22, and the other n-channel enhancement type switching transistor 11h complementarily turns on. Then, the current Is2 inversely flows. The current Is2 has negative value, and the current Is1 has positive value. This results in the waveform of the secondary current Is1 or –Is2 shown in FIG. 11.

The primary winding of the electromagnetic transformer 11e decreases the It and Is2' to zero at time t22 due to the switching action of the transistor 11g. However, the secondary current Is1 flows through the secondary windings of the electromagnetic transformer 11e, and the current Ip1 forms the non-linear waveform shown in FIG. 11.

This is the reason why the currents Id1/Id2 non-linearly flows through the n-channel enhancement type switching transistors 11g/11h and are different from the saw tooth waveform of the prior art driving circuit.

Figure 14:
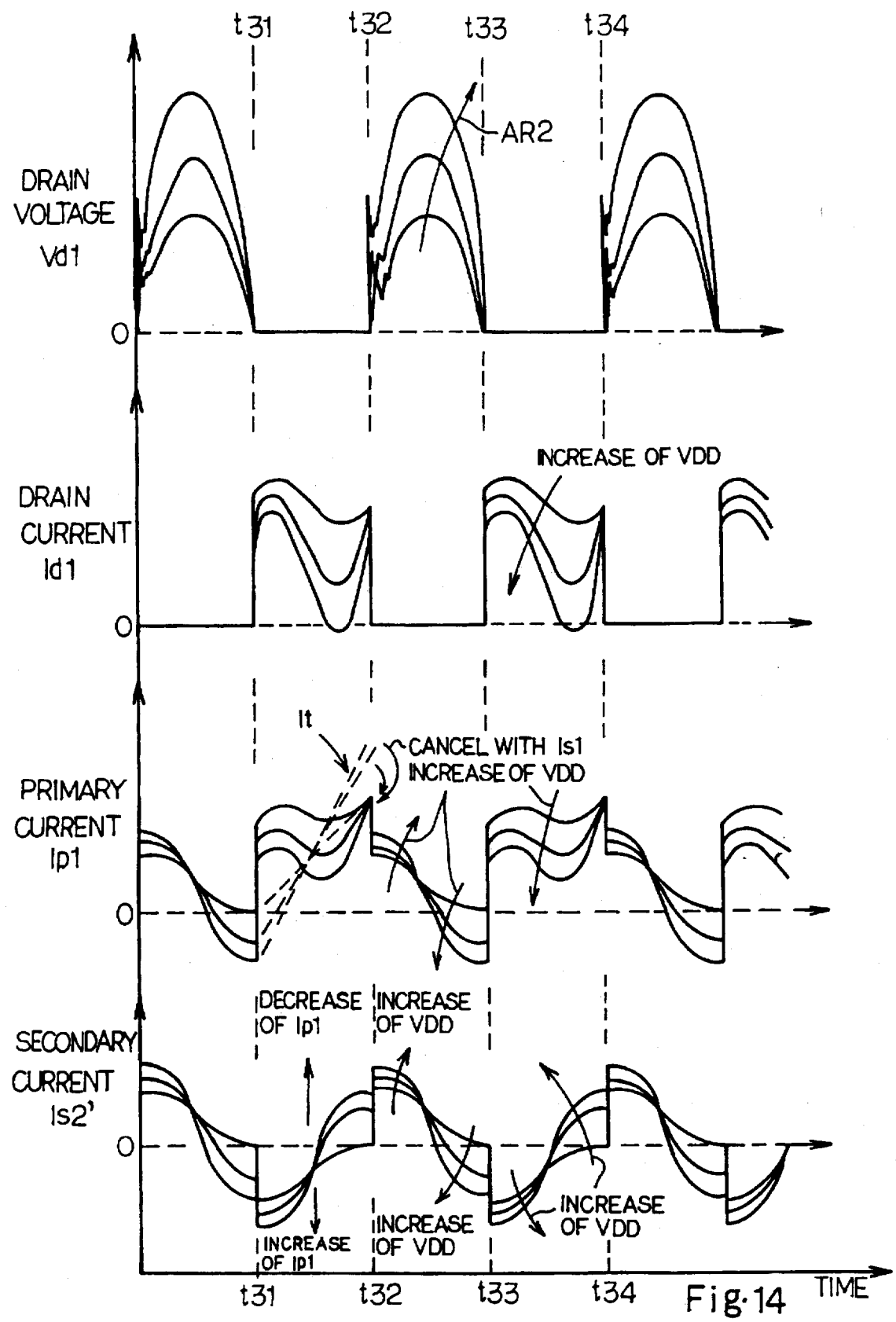
FIG. 14 is a graph showing the currents under fluctuation of a power voltage.

Subsequently, description is made on the circuit behavior of the driving circuit under the fluctuation of the power voltage VDD. When the power voltage VDD is increased, the drain voltage Vd1 is proportionally increased as indicated by arrow AR2 in FIG. 14, and the secondary potential Vs1 is also proportionally increased. The frequency controlling circuit 11c shifts the clock pulse CLK to a higher frequency so as to restrict the discharge current Iout, and the high frequency clock pulse CLK decreases the step-up ratio of the piezoelectric transformer 11b. As a result, the driving circuit maintains the driving electric power constant. Thus, the frequency controlling circuit 11c is effective against the fluctuation of the power voltage VDD.

The frequency controlling circuit 11c is a kind of signal processing circuit, and is easily integrated on a semiconductor chip. The frequency controlling circuit 11c is conducive to the scale-down of the driving circuit and reduction of the production cost.

When the power voltage VDD is increased, the frequency controlling circuit 11c makes the secondary currents Is1/Is2 of the electromagnetic transformers 11e/11f closer to the resonant waveforms due to the reduction of damping resulting from increase of impedance viewed from the primary electrodes 11i of the piezoelectric transformer 11b. For this reason, although the secondary currents Is1 and Is2 become zero at time t31, t32 and t33, the currents are changed across zero at earlier timing (see "secondary current Is1" in FIG. 14).

The current It is overlapped with the current Is2' between time t31 and time t32, and the current Is2' partially cancels the peak of the current It. The current Is1 between time t32 and time t33 becomes negative. Even if the gradient of the current It from time t33 is steep, the peak current in the primary winding of the electromagnetic transformer is not widely increased. Thus, the driving circuit according to the present invention keeps the peak current constant in spite of the undesirable increase of the power voltage VDD, and an electromagnetic transformer with a small capacitance is available for the auto-transformers 11e/11f. This is conducive to the reduction in volume.

As will be appreciated from the foregoing description, the auto-transformers 11e/11f achieve the same step-up ratio as the prior art electromagnetic transformers through a smaller number of turns of the winding, and make the driving circuit according to the present invention small and thin.

Especially, when the n-channel enhancement type switching transistor 11g/11h turns on, the small inductance Lp1/Lp2 charges the primary winding portion with a large amount of current from the power source. On the other hand, when the switching transistor 11g/11h turns off, the total inductance (Lp1+Ls1) or (Lp2+Ls2) makes the electrostatic capacitance CL viewed from the input side of the piezoelectric transformer 11b resonant. Thus, the primary winding portion is dually used in the electromagnetic transformer 11e/11f, and the auto-transformers 11e/11f makes the driving circuit 11 small and thin.

Moreover, even if undesirable fluctuation takes place in the power voltage, the frequency controlling circuit 11c and the 2-phase pulse generator 11d regulate the first and second pulse signals PL11/PL12 so as to appropriately drive the piezoelectric transformer 11b.

If the winding does not fill the bobbin of the electromagnetic transformer, a thick conductive wire is available, and increases the efficiency of the step-up circuit, because it decreases the loss of the transformer.

The present inventor evaluated the driving circuit 11, and followings are data obtained therefrom.

Piezoelectric transformer 11b
input capacitance Cd1: 2645 micro-F
output capacitance Cd2: 32.12 pF
resonant frequency: 111.3 KHz
Auto-transformer
primary inductance Lp: 60 micro-H
secondary inductance Ls: 214 micro-H
primary winding portion Tp: 25 turns
secondary winding portion Ts: 46 turns
turn ratio N: 1.84
winding on the primary side: 0.16 millimeter-phi UEW
winding on the secondary side: 0.12 millimeter-phi UEW
Cold Cathode fluorescent lamp
length L: 220 millimeters
diameter: 3 millimeters
Reflecting plate: yes
equivalent resistance RL2: 80 kilo-ohm
equivalent capacitance CL2: 10 pF
Driving Circuit
power voltage VDD: 8.0 volts peak voltage of the primary voltage Vd1/Vd2: 29 $V_{o-p}$
peak voltage of the secondary voltage Vs1/Vs2: 82 $V_{p-p}$
step-up ratio Vs/Vd: 2.8
driving signal Vin: 433 Vrms=1220 $V_{p-p}$
discharge current Iout: 7.0 milli-$A_{rms}$
peak drain currents Id1/Id2: 0.56 $A_{p-p}$
peak primary currents Ip1/Ip2: 0.46 $A_{p-p}$
peak secondary currents Is1/Is2: 0.36 $A_{p-p}$ Although the particular embodiment of the present invention has been shown and described, it will be obvious to those skilled in the art that various changes and modifications may be made without departing from the spirit and scope of the present invention.

For example, the frequency controlling circuit 11c may regulates the clock signal CLK so as to regulate the driving signal Vin to a target value. In this instance, the driving signal Vin is directly supplied to the rectifier 11m as indicated by broken lines in FIG. 7, and the current-to-voltage converter 11k is deleted from the frequency controlling circuit 11c.

The n-channel enhancement type switching transistors are replaceable with p-channel enhancement type field effect transistors or bipolar transistors.

What is claimed is:

1. A driving circuit for a load comprising:
    a first auto-transformer including a first winding having a first node splitting said first winding into a first primary winding portion connected to a power source and a first secondary winding portion;
    a second auto-transformer including a second winding having a second node splitting said second winding into a second primary winding portion connected to said power source and a second secondary winding portion;
    a first switching transistor including a first control node and a first current path connected between said first node and a constant voltage source;
    a second switching transistor including a second control node and a second current path connected between said second node and said constant voltage source;
    a piezoelectric transformer including primary electrodes respectively connected to said first secondary winding portion and said second secondary winding portion, and a secondary electrode connected to said load; and
    a pulse generating means for supplying a first pulse signal and a second pulse signal complementary to said first pulse signal to said first control node and said second control node, respectively.

2. The driving circuit as set forth in claim 1, in which said pulse generating means includes a two-phase pulse generating circuit for generating said first pulse signal and said second pulse signal from a clock signal, and a frequency controlling circuit responsive to a discharge current from said load for regulating said clock signal so as to make said piezoelectric transformer resonate around a resonant frequency thereof.

3. The driving circuit as set forth in claim 1, in which the secondary winding of one of said first auto-transformer and said second auto-transformer supplies a secondary potential to one of said primary electrodes of said piezoelectric transformer, and said piezoelectric transformer supplies said secondary potential from the other of said primary electrodes to the secondary winding of the other auto-transformer and to said primary winding of the other auto-transformer, said secondary potential being larger than a primary potential by a factor of one plus a turn ratio.

4. The driving circuit as set forth in claim 1, in which said frequency regulating circuit includes a current-to-voltage converting means connected to said load for converting said discharge current to a first potential signal, a first comparator coupled to said current-to-voltage converting means so that said first comparator can change an output signal of said current-to-voltage converting means from a high level to a low level when said first potential signal is higher than a first reference level, a resettable integrator connected to said first comparator and responsive to said output signal of said current-to-voltage converting means at said high level so that said resettable integrator can gradually decrease a second potential signal, a voltage-controlled oscillator connected to said resettable integrator and responsive to said second potential signal for proportionally changing a frequency of said clock signal toward a target frequency close to a resonant frequency of said piezoelectric transformer, and a second comparator connected to said resettable integrator and responsive to said second potential signal having a minimum potential level so as to supply a reset signal to said resettable integrator.

\* \* \* \* \*